(12) United States Patent
Bao

(10) Patent No.: US 10,405,439 B2
(45) Date of Patent: Sep. 3, 2019

(54) DISPLAY PANEL ASSEMBLY AND MANUFACTURING METHOD THEREOF

(71) Applicant: GUANGDONG OPPO MOBILE TELECOMMUNICATIONS CORP., LTD., Dongguan, Guangdong (CN)

(72) Inventor: Xiaoming Bao, Dongguan (CN)

(73) Assignee: GUANGDONG OPPO MOBILE TELECOMMUNICATIONS CORP., LTD., Dongguan, Guangdong (CN)

( * ) Notice: Subject to any disclaimer, the term of this patent is extended or adjusted under 35 U.S.C. 154(b) by 0 days.

(21) Appl. No.: 15/805,908

(22) Filed: Nov. 7, 2017

(65) Prior Publication Data
US 2018/0199449 A1 Jul. 12, 2018

(30) Foreign Application Priority Data

Jan. 9, 2017 (CN) .......................... 2017 1 0013752
Jan. 9, 2017 (CN) ...................... 2017 2 0022984 U

(51) Int. Cl.
*H05K 5/00* (2006.01)
*G06F 1/16* (2006.01)
(Continued)

(52) U.S. Cl.
CPC ............ *H05K 5/0017* (2013.01); *G04G 9/10* (2013.01); *G04G 9/12* (2013.01); *G06F 1/1637* (2013.01); *H05K 5/0243* (2013.01); *H05K 5/03* (2013.01); *H05K 5/04* (2013.01); *G06F 1/1626* (2013.01); *G06F 1/1643* (2013.01); *G06F 3/041* (2013.01); *H04M 1/0266* (2013.01)

(58) Field of Classification Search
CPC ...... H05K 5/0017; H05K 5/04; H05K 5/0243; H05K 5/03; G04G 9/12; G04G 9/10; G06F 1/1637; G06F 3/041; G06F 1/1626; G06F 1/1643; H04M 1/0266
See application file for complete search history.

(56) References Cited

U.S. PATENT DOCUMENTS 6,654,078 B1 * 11/2003 Kato ................. G02F 1/133308
  349/58
8,561,831 B2 * 10/2013 Liao .................. B29C 45/14336
  220/4.01
(Continued)

FOREIGN PATENT DOCUMENTS

CN     202872874 U     4/2013
CN     103853254 A     6/2014
(Continued)

OTHER PUBLICATIONS

English Translation of Yang CN204536993.*

*Primary Examiner* — Abhishek M Rathod
(74) *Attorney, Agent, or Firm* — Hodgson Russ LLP

(57) ABSTRACT

A display panel assembly includes a support, a display panel, a cover plate, and a decorative ring. The support includes a bottom wall and a side wall bent from the bottom wall. A thickness of the side wall is less than a thickness of the bottom wall to form the support. The display panel is fixed to the bottom wall of the support. The cover plate is disposed on the display panel. The decorative ring is disposed on a top end of the side wall of the support away from the bottom wall of the support and joined to a side of the cover plate.

13 Claims, 5 Drawing Sheets

(51) Int. Cl.
  *G04G 9/10* (2006.01)
  *G04G 9/12* (2006.01)
  *H05K 5/02* (2006.01)
  *H05K 5/03* (2006.01)
  *H05K 5/04* (2006.01)
  *G06F 3/041* (2006.01)
  *H04M 1/02* (2006.01)

(56) References Cited

U.S. PATENT DOCUMENTS

| | | | |
|---|---|---|---|
| 2010/0061040 A1* | 3/2010 | Dabov | G06F 1/1626 |
| | | | 361/679.01 |
| 2010/0073583 A1 | 3/2010 | Park et al. | |
| 2012/0281381 A1* | 11/2012 | Sanford | G06F 1/1626 |
| | | | 361/807 |
| 2012/0281383 A1* | 11/2012 | Hwang | G02F 1/133308 |
| | | | 361/807 |
| 2013/0140965 A1* | 6/2013 | Franklin | G06F 1/1626 |
| | | | 312/223.1 |
| 2014/0177154 A1* | 6/2014 | Lee | G06F 1/1656 |
| | | | 361/679.26 |
| 2014/0198436 A1 | 7/2014 | Lim et al. | |
| 2015/0062787 A1* | 3/2015 | Wilson | H04M 1/185 |
| | | | 361/679.01 |
| 2015/0153782 A1* | 6/2015 | Liu | G06F 1/1656 |
| | | | 361/679.26 |
| 2015/0373441 A1 | 12/2015 | Behles et al. | |

FOREIGN PATENT DOCUMENTS

| | | |
|---|---|---|
| CN | 104601753 A | 5/2015 |
| CN | 204376982 U | 6/2015 |
| CN | 204536993 U | 8/2015 |
| CN | 104991366 A | 10/2015 |
| CN | 105376359 A | 3/2016 |
| CN | 106657476 A | 5/2017 |
| CN | 206364859 U | 7/2017 |

* cited by examiner

DISPLAY PANEL ASSEMBLY AND MANUFACTURING METHOD THEREOF

CROSS REFERENCE TO RELATED APPLICATIONS

This application claims priority to Chinese Application No. 201710013752.5 filed Jan. 9, 2017 and Chinese Application No. 201720022984.2 filed Jan. 9, 2017. This application is also related to a co-pending application entitled "display panel assembly and manufacturing method thereof" which claims priority to Chinese Application No. 201710013751.0 filed Jan. 9, 2017 and Chinese Application No. 201720022983.8 filed Jan. 9, 2017. The entire disclosures of the above applications are incorporated herein by reference.

BACKGROUND

Field

The present disclosure relates to the field of electronic devices, and particularly to a display panel assembly and a manufacturing method thereof.

Background

With the development of technologies, smart phones having more functions are becoming more and more popular. Smart phones have become indispensable devices in people's lives. However, display panel assemblies of existing smart phones have a relatively small panel ratio, which reduces user experience.

BRIEF DESCRIPTION OF THE DRAWINGS

The aspects and advantages of the embodiments of the present disclosure will become apparent and easily understood from the following description of the embodiments in conjunction with the accompanying drawings.

DETAILED DESCRIPTION OF ILLUSTRATED EMBODIMENTS

Figure 1:
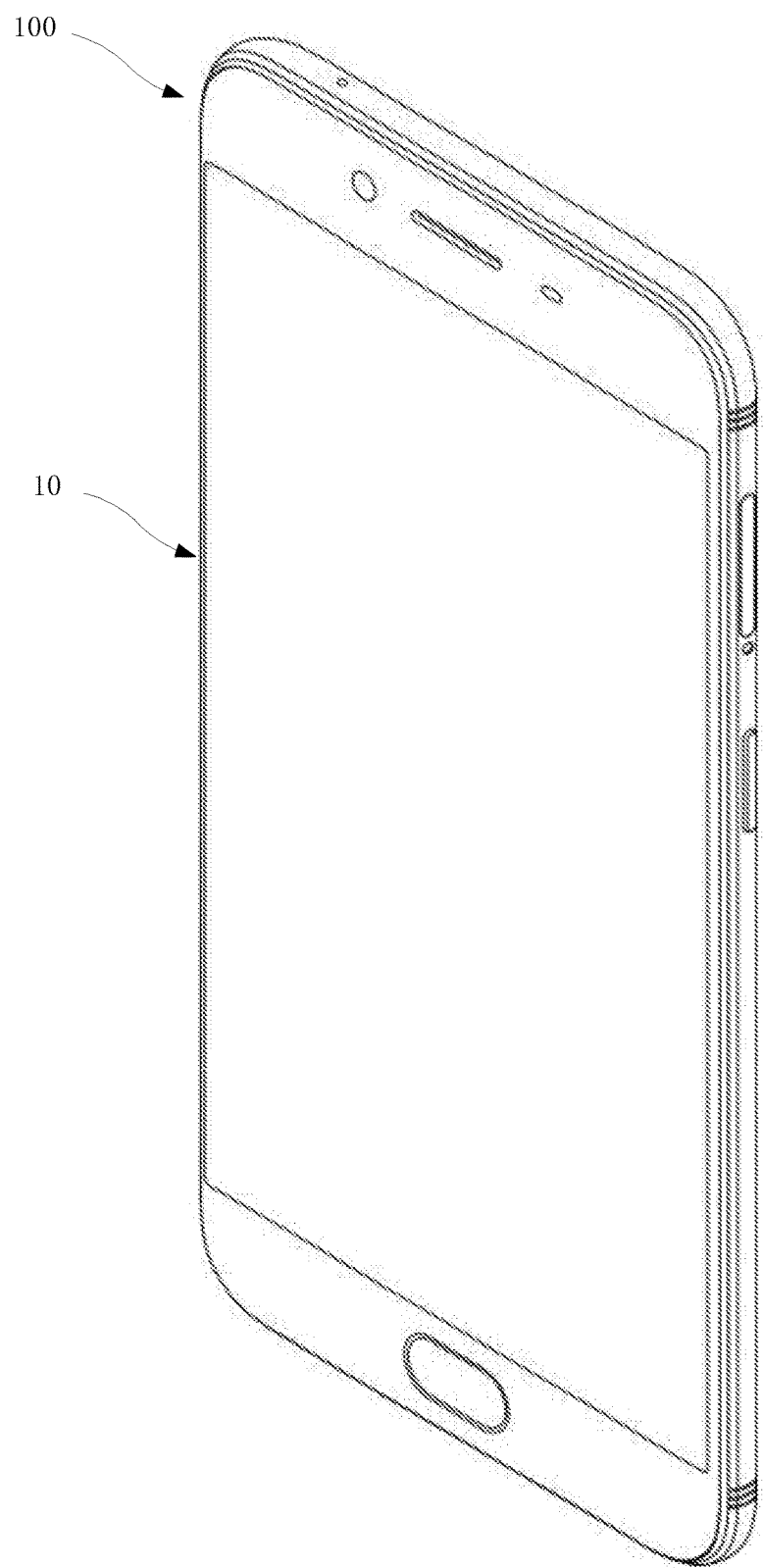
FIG. 1 is a schematic perspective view of an electronic device according to an embodiment of the present disclosure.

The embodiments of the present disclosure are described in detail hereinafter. Examples of the described embodiments are given in the accompanying drawings, wherein the identical or similar reference numerals constantly denote the identical or similar elements or elements having the identical or similar functions. The specific embodiments described with reference to the attached drawings are all exemplary, and are intended to illustrate and interpret the present disclosure, which shall not be construed as causing limitations to the present disclosure.

In the description of the present disclosure, it should be understood that terms such as "center," "longitudinal," "lateral," "length," "width," "thickness," "upper," "lower," "front," "rear," "left," "right," "vertical," "horizontal," "top," "bottom," "inside," "outside," "clockwise," "counterclockwise" as well as derivative thereof should be construed to refer to the orientation as then described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or significance. Thus, features limited by "first" and "second" are intended to indicate or imply including one or more than one these features. In the description of the present disclosure, "a plurality of" relates to two or more than two, unless otherwise specified.

In the description of the present disclosure, it should be noted that unless there are express rules and limitations, the terms such as "mount," "connect," and "bond" should be comprehended in broad sense. For example, it can mean a permanent connection, a detachable connection, or an integrate connection; it can mean a mechanical connection, an electrical connection, or can communicate with each other; it can mean a direct connection, an indirect connection by an intermediate, or an inner communication or an interreaction between two elements. A person skilled in the art should understand the specific meanings in the present disclosure according to specific situations.

In the description of the present disclosure, unless specified or limited otherwise, it should be noted that, a structure in which a first feature is "on" or "beneath" a second feature may include an embodiment in which the first feature directly contacts the second feature, and may also include an embodiment in which an additional feature is formed between the first feature and the second feature so that the first feature does not directly contact the second feature. Furthermore, a first feature "on," "above," or "on top of" a second feature may include an embodiment in which the first feature is right "on," "above," or "on top of" the second feature, and may also include an embodiment in which the first feature is not right "on," "above," or "on top of" the second feature, or just means that the first feature has a sea level elevation greater than the sea level elevation of the second feature. While first feature "beneath," "below," or "on bottom of" a second feature may include an embodiment in which the first feature is right "beneath," "below," or "on bottom of" the second feature, and may also include an embodiment in which the first feature is not right "beneath," "below," or "on bottom of" the second feature, or just means that the first feature has a sea level elevation less than the sea level elevation of the second feature.

The disclosure herein provides many different embodiments or examples for realizing different structures of the present disclosure. In order to simplify the disclosure of the present disclosure, components and settings of specific examples are described below. Of course, they are only examples and are not intended to limit the present disclosure. Furthermore, reference numbers and/or letters may be repeated in different examples of the present disclosure.

Such repetitions are for simplification and clearness, which per se do not indicate the relations of the discussed embodiments and/or settings. Moreover, the present disclosure provides examples of various specific processes and materials, but the applicability of other processes and/or application of other materials may be appreciated by a person skilled in the art.

Figure 2:
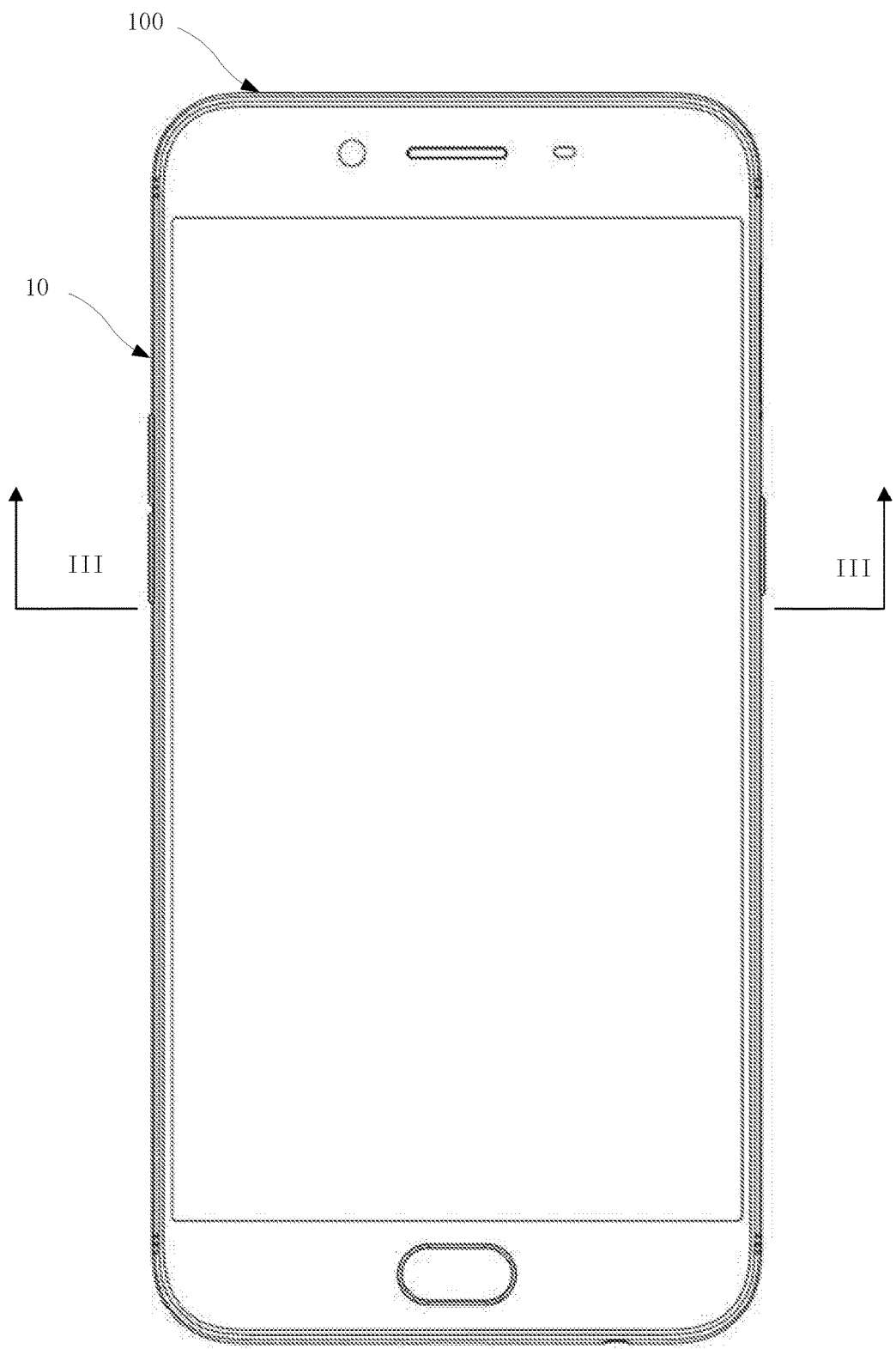
FIG. 2 is a schematic plan view of a display panel assembly according to an embodiment of the present disclosure.

Referring to FIG. 1 and FIG. 2, an electronic device 100 according to an embodiment of the present disclosure includes a display panel assembly 10. The electronic device 100 includes, but is not limited to, a mobile phone, a tablet, or a smart watch, etc.

Figure 3:
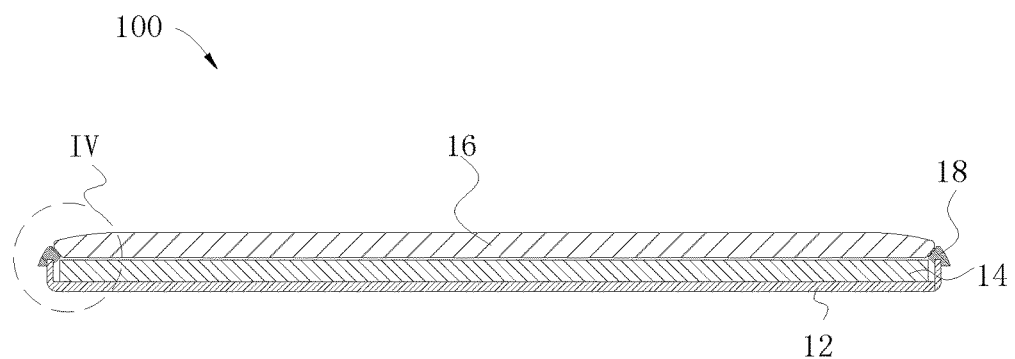
FIG. 3 is a schematic cross-sectional view of the display assembly taken along line III-III of FIG. 2.

In some embodiments, the display panel assembly 10 is configured to display an image, a text, etc., and the display panel assembly 10 may also be configured to receive a touch operation of a user. Referring to FIG. 3, the display assembly 10 includes a support 12, a display panel 14, a cover plate 16, and a decorative ring 18.

Figure 4:
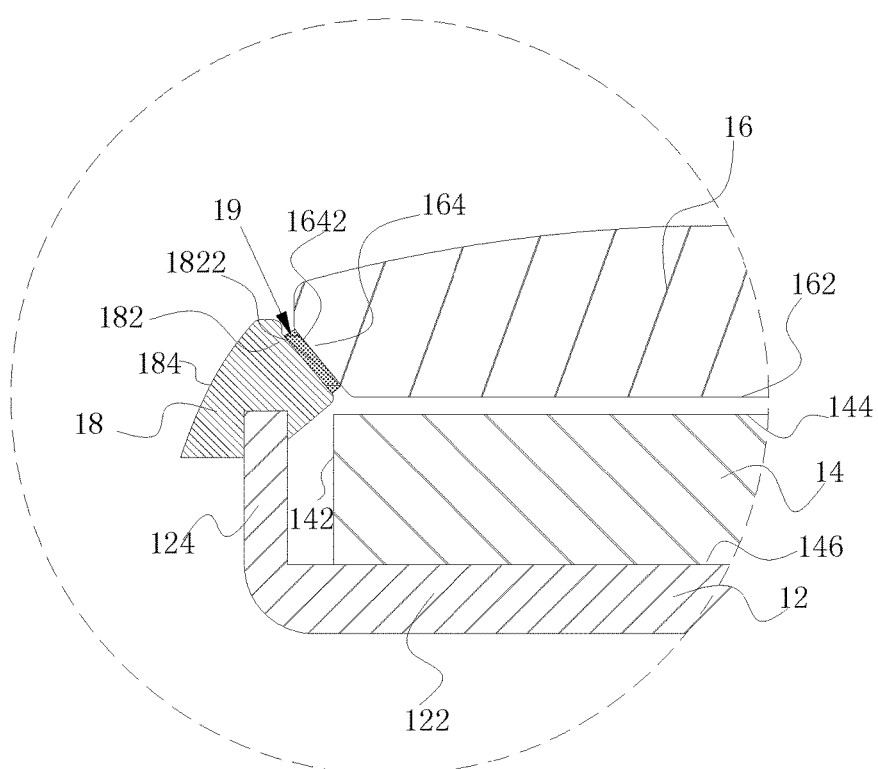
FIG. 4 is an enlarged schematic view of a portion designated IV in FIG. 3.

In conjunction with FIG. 4, the support 12 includes a bottom wall 122 and a side wall 124 bent from the bottom wall 122. A thickness of the side wall 124 is less than a thickness of the bottom wall 122. The bottom wall 122 is configured to support the display panel 14. In detail, the thickness of the bottom wall 122 ranges from greater than or equal to 0.4 mm to less than or equal to 0.5 mm. The bottom wall 122 is, for example, 0.4 mm, 0.42 mm, 0.44 mm, 0.46 mm, 0.48 mm, or 0.5 mm, etc. The thickness of the side wall 124 ranges from greater than or equal to 0.2 mm to less than 0.4 mm, for example, 0.2 mm, 0.25 mm, 0.28 mm, 0.30 mm, 0.34 mm, 0.39 mm, etc. The support 12 is press formed to obtain an intermediate workpiece having an equal wall thickness, and the side wall 124 is etched such that the thickness of the side wall 124 is less than the thickness of the bottom wall 122. In the embodiment of the present disclosure, the bottom wall 122 is perpendicular to the side wall 124, and the side wall 124 may be two or four. In other words, the side wall 124 may extend from both ends of the bottom wall 122 or may extend around the bottom wall 122. In other embodiments, the bottom wall 122 and the side wall 124 may also not be perpendicular to each other. Material of the support 12 may be metallic material such as steel, aluminum alloy, or magnesium alloy. In detail, in the embodiment of the present disclosure, material of the support 12 is steel, the thickness of the bottom wall 122 is 0.4 mm, and the thickness of the side wall 124 is 0.2 mm. In one embodiment, material of the support 12 is magnesium alloy, the thickness of the bottom wall 122 is 0.5 mm, and the thickness of the side wall 124 is 0.2 mm. In other embodiments, material of the support 12 may also be a non-metallic material such as acrylonitrile-butadiene-styrene (ABS) copolymer, polyvinyl chloride (PVC), or polycarbonate (PC). Material of the support 12 is not limited to the above material, and a suitable material may be selected according to the demand in practical application.

The display panel 14 is fixed to the bottom wall 122 of the support 12. The display panel 14 may be a liquid crystal display (LCD) panel, an organic light-emitting diode (OLED) display panel or a flexible OLED display panel. The display panel 14 includes a display area and a non-display area. The display area is configured to display an image, a text, etc. of the display panel assembly 10. A side 142 of the display panel 14 is disposed opposite to the side wall 124.

The cover plate 16 is disposed on the display panel 14. A bottom surface 162 of the cover plate 16 and a top surface 144 of the display panel 14 can be joined in fully fitting manner. In detail, the bottom surface 162 and the top surface 144 can be joined by an optical clear adhesive (OCA). In the embodiment of the present disclosure, the cover plate 16 is a touch panel cover, that is, touch lines of a touch panel are integrated in the cover plate 16, and a touch operation can be realized by clicking on the cover plate 16. The cover plate 16 may be made of glass, sapphire, or polyvinyl chloride (PVC), etc. In some embodiments, the cover plate 16 includes a two-layer structure including a touch panel and a protective cover disposed on the touch panel. The touch panel is configured to perform a touch operation of the display panel assembly 10. The protective cover is configured to protect the touch panel from touching the touch panel to avoid direct touch operation of the touch panel.

The decorative ring 18 is disposed on the support 12, material of the decorative ring 18 is plastic, and the decorative ring 18 is joined to the support 12 by an in-mold injection molding process. The decorative ring 18 is disposed on a top end of the side wall 124 away from the bottom wall 122 and is joined to a side 164 of the cover plate 16. An inner wall 182 of the decorative ring 18 includes a first joining surface 1822, the side 164 of the cover plate 16 includes a second joining surface 1642 opposite the first joining surface 1822, and the first joining surface 1822 and the second joining surface 1642 are inclined with respect to the side wall 124. In other words, the first joining surface 1822 and the second joining surface 1642 are inclined planes. The decorative ring 18 is joined to the side 164 of the cover plate 16 by gluing. In detail, the decorative ring 18 is joined to the side 164 of the cover plate 16 by dispensing a glue 19 to the side 164 of the cover plate 16. The glue 19 may be a gluewater, a solid glue, an ultraviolet curing glue, etc. An end of the first joining surface 1822 is closer to the display panel 14 relative to the side wall 124, that is, the first joining surface 1822 of the decorative ring 18 extends beyond the side wall 124 such that there is a gap between the display panel 14 and the side wall 124. An outer wall 184 of the decorative ring 18 has a curved arc shape. It is to be understood that the decorative ring 18 may be disposed around the side 164 of the cover plate 16.

The support 12 of the display panel assembly 10 according to the embodiment of the present disclosure is press formed to obtain the intermediate workpiece having the equal wall thickness, and the side wall 124 is etched such that the thickness of the side wall 124 is less than the thickness of the bottom wall 122, so as to satisfy requirements of strength and rigidity of the support 12, and the thickness of the side wall 124 is reduced. When the display panel assembly 10 of the embodiment of the present disclosure is applied to the electronic device 100, entire width of the electronic device 100 is reduced.

The display panel assembly 10 of the embodiment of the present disclosure uses a press forming process to obtain the intermediate workpiece having the equal wall thickness, and then a side wall of the intermediate workpiece is etched by an etching process. A side of the side wall 124 opposite to the side 142 of the display panel 14 is partially etched to obtain the support 12, the support 12 is subjected to an in-mold injection molding process, the decorative ring 18 is joined to the support 12, and then the second joining surface 1642 of the cover plate 16 and the first joining surface 1822 of the decorative ring 18 are joined by dispensing the glue. The display panel 14 and the cover plate 16 fully fitted to each other are disposed on the support 12, and a bottom surface 146 of the display panel 14 is joined to the bottom wall 122 by gluing to form the display panel assembly 10. It is to be understood that the bottom surface 146 of the display panel 14 may be connected to the bottom wall 122 by gluing, and then the display panel 14 and the cover plate 16 are fully fitted.

The electronic device 100 according to the embodiment of the present disclosure can reduce entire width, save space and facilitate user operation by reducing the thickness of the side wall 124 of the support 12 of the display panel assembly 10 on one hand. It can also be achieved without increasing the entire width of the premise, increase size of the display to improve the panel ratio, to bring users a better experience of the operation on another hand.

Further, the decorative ring 18 is joined to the support 12 by the in-mold injection molding process. The in-mold injection molding process allows the decorative ring 18 to be better fitted with the support 12. The first joining surface 1822 and the second joining surface 1642 are inclined with respect to the side wall 124 to reduce horizontal widths and facilitate narrowing the width of the display panel assembly 10. The first joining surface 1822 and the second joining surface 1642 are joined by dispensing the glue, and the width required for the dispensing is small, and entire size of the electronic device 100 is made smaller.

Further, the intermediate workpiece is obtained by press forming, the side wall of the intermediate workpiece is etched by the etching process, and the side of the side wall 124 opposite to the side 142 of the display panel 14 is partially etched to obtain the support 12, this molding method can reduce the thickness of the side wall 124 while ensuring that strength and rigidity of the support 12 meet the requirements. The material of the support 12 is metallic material, since mechanical properties of the metallic material are superior to those of ordinary plastics. The strength and rigidity of the support 12 can be increased, and the thickness of the support 12 can be reduced, thereby reducing entire volume of the electronic apparatus 100.

Figure 5:
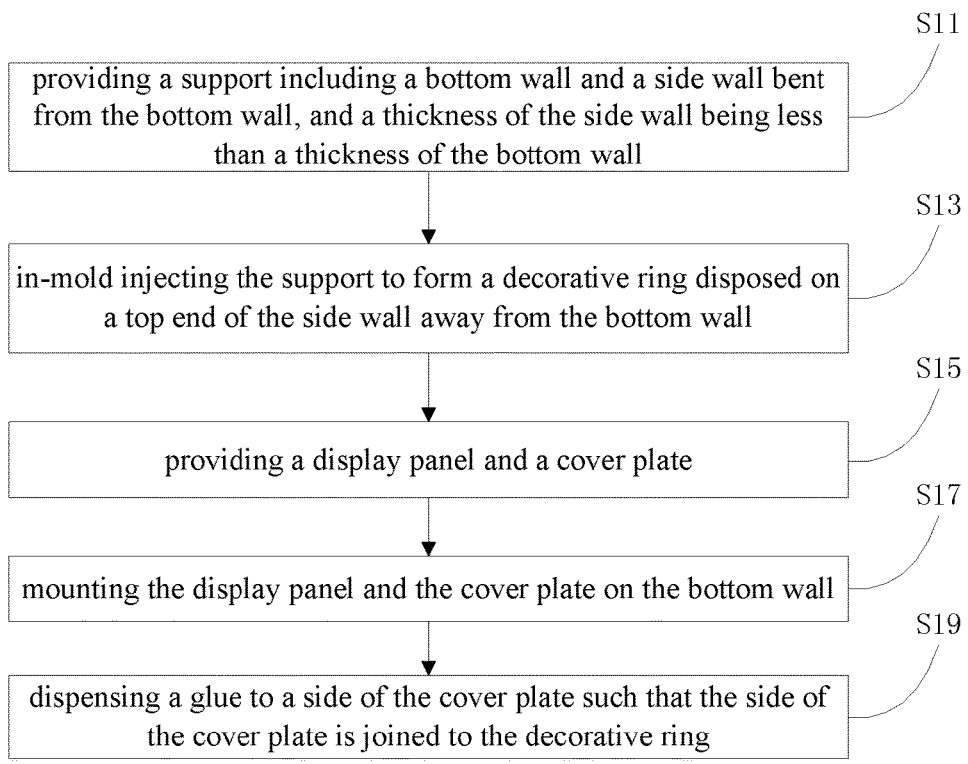
FIG. 5 is a flowchart illustrating a manufacturing method according to an embodiment of the present disclosure.

Referring to FIG. 5, a manufacturing method of an embodiment of the present disclosure for manufacturing the display panel assembly 10 according to any one of the above embodiments, the display panel assembly 10 may also be used to receive a touch operation of a user. The manufacturing method includes following blocks:

In block S11: providing a support 12 including a bottom wall 122 and a side wall 124 bent from the bottom wall 122, and a thickness of the side wall 124 being less than a thickness of the bottom wall 124.

In block S13: in-mold injecting the support 12 to form a decorative ring 18 disposed on a top end of the side wall 124 of the support 12 away from the bottom wall 122.

In block S15: providing a display panel 14 and a cover plate 16.

In block S17: mounting the display panel 14 and the cover plate 16 on the bottom wall 122.

In block S19: dispensing a glue to a side of the cover plate 16 such that the side of the cover plate 16 is joined to the decorative ring 18.

Figure 6:
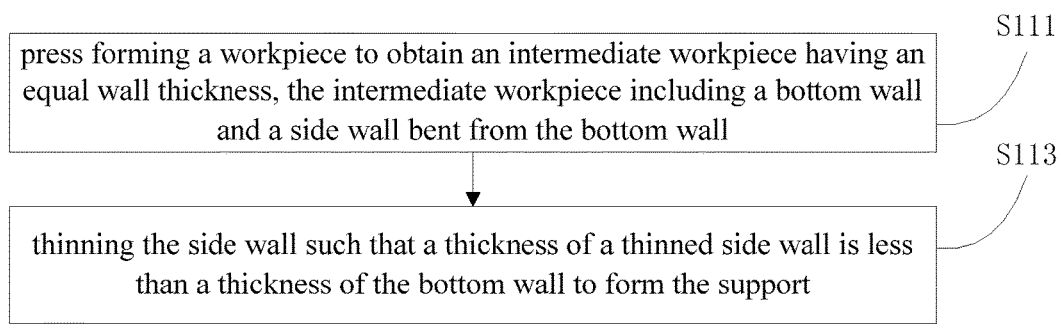
FIG. 6 is a flowchart illustrating a manufacturing method according to the embodiment of the present disclosure.

Referring to FIG. 6, block S11 includes following blocks:

In block S111: press forming a workpiece to obtain an intermediate workpiece having an equal wall thickness, the intermediate workpiece including a bottom wall and a side wall bent from the bottom wall of the intermediate workpiece.

In block S113: thinning the side wall of the intermediate workpiece such that a thickness of a thinned side wall 124 of the intermediate workpiece is less than a thickness of the bottom wall 122 of the intermediate workpiece to form the support 12.

Material of the support 12 may be metallic material such as steel, aluminum alloy, or magnesium alloy. In detail, in the embodiment of the present disclosure, material of the support 12 is steel, the thickness of the bottom wall 122 is 0.4 mm, and the thickness of the side wall 124 is 0.2 mm. In one embodiment, material of the support 12 is magnesium alloy, the thickness of the bottom wall 122 is 0.5 mm, and the thickness of the side wall 124 is 0.2 mm. In other embodiments, material of the support 12 may also be a non-metallic material such as acrylonitrile-butadiene-styrene (ABS) copolymer, polyvinyl chloride (PVC), or polycarbonate (PC). Material of the support 12 is not limited to the above material, and a suitable material may be selected according to the demand in practical application. In detail, the thickness of the bottom wall 122 ranges from greater than or equal to 0.4 mm to less than or equal to 0.5 mm. The bottom wall 122 is, for example, 0.4 mm, 0.42 mm, 0.44 mm, 0.46 mm, 0.48 mm, or 0.5 mm, etc. The thickness of the side wall 124 ranges from greater than or equal to 0.2 mm to less than 0.4 mm, for example, 0.2 mm, 0.25 mm, 0.28 mm, 0.30 mm, 0.34 mm, 0.39 mm, etc.

An inner wall 182 of the decorative ring 18 includes a first joining surface 1822, the side 164 of the cover plate 16 includes a second joining surface 1642 opposite the first joining surface 1822, and the first joining surface 1822 and the second joining surface 1642 are inclined with respect to the side wall 124. In other words, the first joining surface 1822 and the second joining surface 1642 are inclined planes. The decorative ring 18 is joined to the side 164 of the cover plate 16 by gluing. In detail, the decorative ring 18 is joined to the side 164 of the cover plate 16 by dispensing a glue 19 to the side 164 of the cover plate 16. The glue 19 may be a gluewater, a solid glue, an ultraviolet curing glue, etc. An end of the first joining surface 1822 is closer to the display panel 14 relative to the side wall 124, that is, the first joining surface 1822 of the decorative ring 18 extends beyond the side wall 124 such that there is a gap between the display panel 14 and the side wall 124. An outer wall 184 of the decorative ring 18 has a curved arc shape. It is to be understood that the decorative ring 18 may be disposed around the side 164 of the cover plate 16.

Block S113 is realized by etching.

Figure 7:
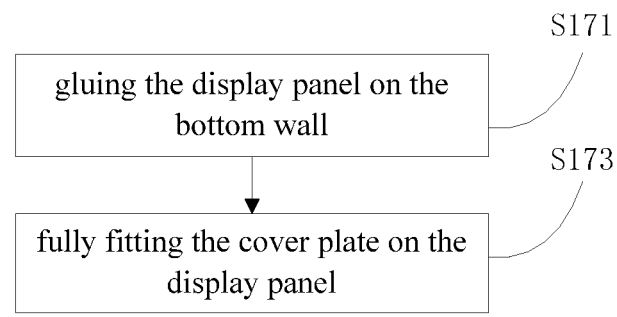
FIG. 7 is a flowchart illustrating a manufacturing method according to the embodiment of the present disclosure.

Referring to FIG. 7, block S17 includes following blocks:

In block S171: gluing the display panel 14 on the bottom wall 122.

In block S173: fully fitting the cover plate 16 on the display panel 14.

The support 12 of the display panel assembly 10 manufactured by the manufacturing method of the embodiment of the present disclosure is press formed to obtain the intermediate workpiece having the equal wall thickness, and the side wall 124 is etched such that the thickness of the side wall 124 is less than the thickness of the bottom wall 122, so as to satisfy requirements of strength and rigidity of the support 12, and the thickness of the side wall 124 is reduced. When the display panel assembly 10 of the embodiment of the present disclosure is applied to the electronic device 100, the electronic device 100 can reduce entire width, save space and facilitate user operation on one hand. It can also be achieved without increasing the entire width of the premise, increase size of the display to improve the panel ratio, to bring users a better experience of the operation on another hand.

The electronic device 100 according to the embodiment of the present disclosure can reduce entire width, save space and facilitate user operation by reducing the thickness of the side wall 124 of the support 12 of the display panel assembly 10 on one hand. It can also be achieved without increasing the entire width of the premise, increase size of the display to improve the panel ratio, to bring users a better experience of the operation on another hand.

Further, the decorative ring 18 is joined to the support 12 by the in-mold injection molding process. The in-mold injection molding process allows the decorative ring 18 to be better fitted with the support 12. The first joining surface 1822 and the second joining surface 1642 are inclined with respect to the side wall 124 to reduce horizontal widths and facilitate narrowing the width of the display panel assembly 10. The first joining surface 1822 and the second joining surface 1642 are joined by dispensing the glue, and the width required for the dispensing is small, and entire size of the electronic device 100 is made smaller.

Further, the intermediate workpiece is obtained by press forming, the side wall of the intermediate workpiece is etched by the etching process, and the side of the side wall 124 opposite to the side 142 of the display panel 14 is partially etched to obtain the support 12, this molding method can reduce the thickness of the side wall 124 while ensuring that strength and rigidity of the support 12 meet the requirements. The material of the support 12 is metallic material, since mechanical properties of the metallic material are superior to those of ordinary plastics. The strength and rigidity of the support 12 can be increased, and the thickness of the support 12 can be reduced, thereby reducing entire volume of the electronic apparatus 100.

Figure 8:
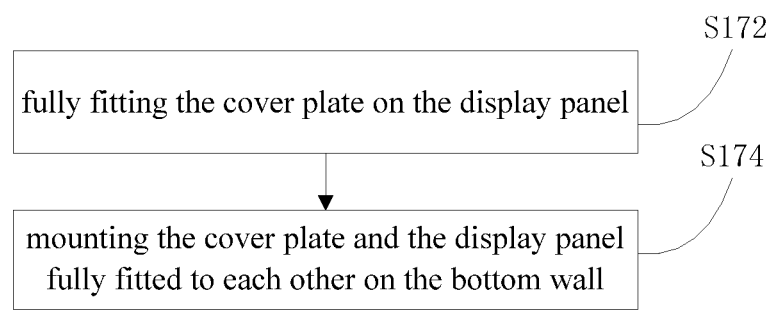
FIG. 8 is a flowchart illustrating a manufacturing method according to another embodiment of the present disclosure.

Referring to FIG. 8, in some embodiments, block S17 includes following blocks:

In block S172: fully fitting the cover plate 16 on the display panel 14.

In block S174: mounting the cover plate 16 and the display panel 14 fully fitted to each other on the bottom wall 122.

It is to be understood that the display panel 14 may be glued to the bottom wall 122 and then the cover plate 16 is fully fitted on the display panel 14. It may be also to fully fit the cover plate 16 on the display panel 14, and then the cover plate 16 and the display screen 14 fully fitted are mounted on the bottom wall 122.

In the description of this specification, the description of the terms "one embodiment," "some embodiments," "exemplary embodiment," "examples," "specific examples," or "some examples," etc., means to refer to the specific feature, structure, material or characteristic described in connection with the embodiments or examples being included in at least one embodiment or example of the present disclosure. In the present specification, the term of the above schematic representation is not necessary for the same embodiment or example. Furthermore, the specific feature, structure, material, or characteristic described may be in combination in a suitable manner in any one or more of the embodiments or examples.

In addition, terms such as "first" and "second" are used herein for purposes of description and are not intended to indicate or imply relative importance or significance or to imply the number of indicated technical features. Thus, the feature defined with "first" and "second" may include one or more of this feature. In the description of the present disclosure, "a plurality of" means two or more than two, unless specified otherwise.

The foregoing descriptions are merely exemplary embodiments of the present disclosure, rather than limiting the present disclosure. Various modifications and alterations may be made to the present disclosure for a person skilled in the art. Any modification, equivalent substitution, improvement or the like made within the spirit and principle of the present disclosure shall fall into the protection scope of the present disclosure.

What is claimed is:

1. A display panel assembly, comprising:
   a support comprising a bottom wall and a side wall bent from the bottom wall, a thickness of the side wall being less than a thickness of the bottom wall to form the support;
   a display panel fixed to the bottom wall of the support;
   a cover plate disposed on the display panel, the cover plate including a top surface facing away from the display panel, a bottom surface opposite the top surface and facing the display panel; and
   a decorative ring disposed on a top end of the side wall of the support away from the bottom wall of the support and joined to a side of the cover plate, the side of the cover plate located between the top surface and the bottom surface;
   wherein an inner wall of the decorative ring comprises a first joining surface, which extends beyond the side wall of the support and joins the decorative ring to the side of the cover plate;
   wherein an innermost wall of the side wall of the support is offset from an outermost wall of the display panel to define a gap;
   wherein the gap lies between a first plane, located along the innermost wall of the side wall of the support, and a second plane, located along the outermost wall of the display panel, the first joining surface lying between the first plane and the second plane;
   wherein the side of the cover plate comprises a second joining surface opposite to the first joining surface, the first joining surface and the second joining surface are inclined with respect to the side wall of the support.

2. The display panel assembly as claimed in claim 1, wherein the support is press formed and the side wall of the support is etched such that the thickness of the side wall of the support is less than the thickness of the bottom wall of the support.

3. The display panel assembly as claimed in claim 1, wherein the thickness of the side wall of the support ranges from greater than or equal to 0.2 mm to less than 0.4 mm.

4. The display panel assembly as claimed in claim 1, wherein the thickness of the bottom wall of the support ranges from greater than or equal to 0.4 mm to less than or equal to 0.5 mm.

5. The display panel assembly as claimed in claim 1, wherein material of the support is steel, aluminum alloy, or magnesium alloy.

6. The display panel assembly as claimed in claim 1, wherein the decorative ring is joined to the support by an in-mold injection molding process.

7. The display panel assembly as claimed in claim 1, wherein an outer wall of the decorative ring has a curved arc shape.

8. The display panel assembly as claimed in claim 1, wherein material of the support is steel, the thickness of the bottom wall is 0.4 mm, and the thickness of the side wall is 0.2 mm.

9. The display panel assembly as claimed in claim 1, wherein material of the support is magnesium alloy, the thickness of the bottom wall is 0.5 mm, and the thickness of the side wall is 0.2 mm.

10. The display panel assembly as claimed in claim 1, wherein material of the decorative ring is plastic.

11. The display panel assembly as claimed in claim 1, wherein an inner wall of the decorative ring comprises a first joining surface, the side of the cover plate comprises a second joining surface opposite to the first joining surface, and the first joining surface and the second joining surface are inclined planes.

12. The display panel assembly as claimed in claim 11, wherein an end of the first joining surface is closer to the display panel relative to the side wall of the support.

13. The display panel assembly as claimed in claim 1, wherein the display panel assembly is a mobile phone, a tablet, or a smart watch.

* * * * *